(12) United States Patent
Rahim et al.

(10) Patent No.: US 7,210,115 B1
(45) Date of Patent: Apr. 24, 2007

(54) METHODS FOR OPTIMIZING PROGRAMMABLE LOGIC DEVICE PERFORMANCE BY REDUCING CONGESTION

(75) Inventors: Irfan Rahim, San Jose, CA (US); Yow-Juang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 405 days.

(21) Appl. No.: 10/884,612

(22) Filed: Jul. 2, 2004

(51) Int. Cl.
*G06F 17/50* (2006.01)

(52) U.S. Cl. .............................. 716/16; 716/17; 716/18

(58) Field of Classification Search .................. 716/16, 716/17, 18
See application file for complete search history.

(56) References Cited

U.S. PATENT DOCUMENTS

| | | | | |
|---|---|---|---|---|
| 6,002,991 | A * | 12/1999 | Conn, Jr. .................... | 702/117 |
| 6,184,702 | B1 * | 2/2001 | Takahashi et al. ............ | 326/21 |
| 6,363,516 | B1 * | 3/2002 | Cano et al. .................... | 716/5 |
| 6,670,825 | B1 * | 12/2003 | Lane et al. .................... | 326/41 |
| 6,933,869 | B1 * | 8/2005 | Starr et al. .................. | 341/120 |

OTHER PUBLICATIONS

"Synopsys Products: Galaxy Power", pp. 1-2 (Jul. 1, 2004), Data sheet of Synopsys corporation from Internet at http://www.synopsys.com/products/solutions/galaxy.power.html.

"Synopsys Products: Astro-Xtalk Data Sheet", pp. 1-3 (Jul. 1, 2004), Data sheet of Synopsys corporation from Internet at http://www.synopsys.com/products/solutions/avmrg/astro_xtalk_ds.html.

"Signalstorm NDC Datasheet" pp. 1-3 (May 2004), Data sheet of Cadence corporation.

"Metalink: CeltIC Crosstalk Analyzer detected elusive signal integrity problems prior to tapeout", pp. 1-2 (Jul. 1, 2004) Data sheet of Cadence corporation from http://www.cadence.com/company/success_stories/metalink1_ss.aspx.

* cited by examiner

*Primary Examiner*—Sun James Lin
(74) *Attorney, Agent, or Firm*—G. Victor Treyz

(57) ABSTRACT

Methods and apparatus for designing and producing programmable logic devices are provided. A logic design system may be used to analyze various implementations of a desired logic design for a programmable logic device integrated circuit. The logic design system may be used to produce configuration data for the programmable logic device in accordance with an optimized implementation. A logic circuit for a programmable logic device can be analyzed by taking into account the effects of hotspots, power supply voltage drops, and signal congestion on device performance. By modeling the performance of transistors and other components using position-dependent and signal-dependent variables such as temperature, voltage, and capacitance, the effects of congestion on device performance can be characterized and an optimum implementation of the logic design in a programmable logic device can be obtained.

20 Claims, 15 Drawing Sheets

METHODS FOR OPTIMIZING PROGRAMMABLE LOGIC DEVICE PERFORMANCE BY REDUCING CONGESTION

BACKGROUND OF THE INVENTION

This invention relates to programmable logic devices, and more particularly, to optimizing logic designs for programmable logic devices by taking into account the effects of congestion.

Programmable logic devices are a type of integrated circuit that can be programmed by a user to implement a desired custom logic function. In a typical scenario, a logic designer uses computer-aided design (CAD) tools to design a custom logic circuit. These tools use information on the hardware capabilities of a given programmable logic device to help the designer implement the custom logic circuit using the resources available on that given programmable logic device. To ensure that the customized programmable logic device performs satisfactorily, the computer-aided design tools optimize the placement and routing of resources on the device.

As semiconductor fabrication methods improve, it is becoming possible to fabricate transistors and other integrated circuit components with increasingly small dimensions. It is generally desirable to shrink component sizes and otherwise scale devices as much as possible to reduce costs and improve performance. However, as devices become smaller, the effects of circuit congestion become increasingly important to consider.

Congestion can lead to a number of problems. If circuits are spaced too closely or if too many components are active, the power supply voltage on certain power supply lines may droop due to current loading effects. Local heating can give rise to hotspots on a device, which can adversely affect circuit performance. Sometimes signals interact poorly with each other and produce crosstalk.

With conventional programmable logic device CAD tools, designs are optimized during placement and routing operations by considering resistance-capacitance (RC) circuit delay effects. Using this type of information, a conventional programmable logic device CAD tool may decide to move certain portions of logic on a programmable logic device to improve performance. If, for example, a certain block of logic must frequently access a hardwired multiplier circuit and a memory, the CAD tool can place that block of logic adjacent to the multiplier circuit and the memory, thereby reducing interconnect delays.

However, programmable logic device CAD tools do not adequately address the effects of congestion. For example, while it may be possible to estimate the operating temperature of a programmable logic device, existing tools are not able to identify hotspots or areas where supply voltages droop due to signal loading. It may be possible to estimate cross-talk noise on certain nodes in a circuit with existing tools, but existing tools are not able to optimize a circuit to reduce cross-talk problems. Moreover, it is not possible to use custom-logic or application-specific integrated circuit (ASIC) design tools to address these issues, because those tools are incapable of creating custom logic designs for programmable logic devices.

It would therefore be desirable to be able to optimize programmable logic device designs by taking into account the effects of circuit congestion.

SUMMARY OF THE INVENTION

Methods and apparatus are provided for analyzing various implementations of a given logic design in a programmable logic device integrated circuit. Effects such as temperature, power supply voltage, and capacitance (cross-talk) can be considered when modeling the performance of transistors, resistors, interconnect lines, and other components on the programmable logic device.

Computer-aided-design tools may be used to receive a desired logic design for a programmable logic device integrated circuit from a logic designer. The logic designer may provide the tools with information on design constraints (e.g., timing requirements, maximum acceptable noise levels, etc.).

The computer-aided design tools can analyze various possible implementations of the logic design in the programmable logic device integrated circuit to identify an optimized implementation of the design.

When circuitry is congested, the temperature of a programmable logic device may be elevated in particular regions (called hotspots). Signal cross-talk can be affected by signal proximity and signal type. The amount of current that is drawn through various power supply lines can produce voltage drops that reduce the power supply voltage level supplied to various transistors and other circuit components.

These position-dependent and signal-dependent effects can be modeled. For example, reductions in transistor drive current with increasing temperature and decreasing power supply voltage and changes in resistances due to temperature variations can be modeled by the computer-aided design tools. The tools can also analyze signal proximity and signal types to estimate cross-talk levels. By taking into account these position-dependent and signal-dependent effects when analyzing the implementations of the logic design, the computer-aided design tools can optimize performance by reducing congestion.

When an optimized design implementation has been identified, the computer-aided design tools can be used to produce corresponding configuration data for loading into a programmable logic device or for mask-programming a programmable logic device.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to programmable logic device integrated circuits. The invention also relates to tools and methods for designing and programming optimized programmable logic devices.

Programmable logic devices are integrated circuits that can be configured by a user to perform custom logic functions. Electrically-programmed programmable logic devices are configured ("programmed") by loading configuration data into the device. The configuration data selectively turns on and off components of the device's circuitry and thereby customizes the logic on the device. Mask-programmed programmable logic devices are similar to electrically-programmed programmable logic devices, but are customized using customized lithographic masks based on the configuration data rather than by electrically loading the configuration data into the device.

The present invention may be used in the context of any integrated circuit that has circuitry that can be configured by a user to perform a custom function, but is described in the context of programmable logic devices for clarity.

Figure 1:
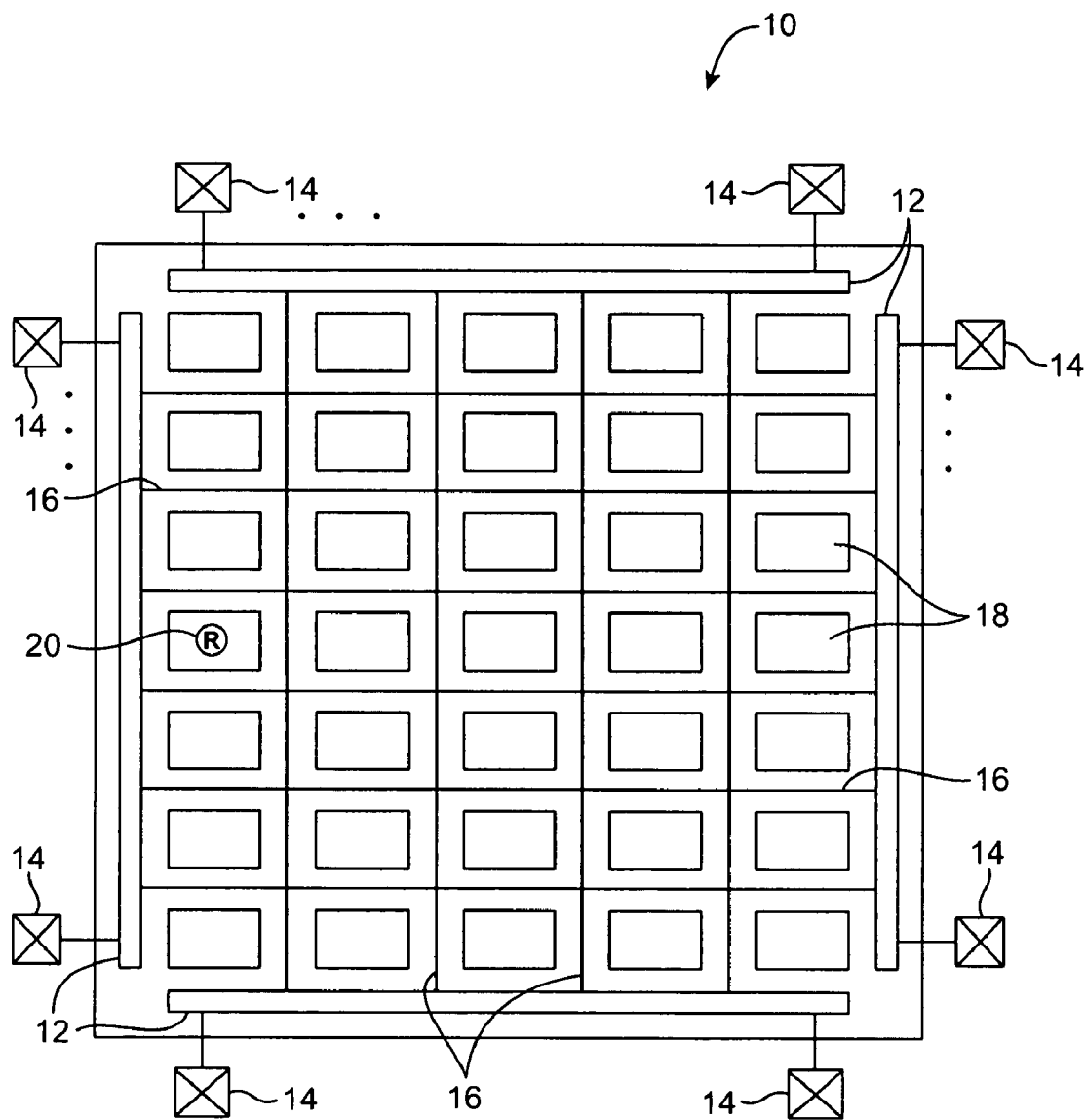
FIG. 1 is a diagram of an illustrative programmable logic device in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals, other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or programmable function control elements) each provide a static control output signal that controls the state of an associated logic component in the programmable logic of circuitry 18.

In a typical arrangement, the programmable elements may be random-access memory (RAM) cells that are loaded from an external chip via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from fuses or antifuses (laser blown or electrically configured), programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc. An illustrative programmable logic element is shown schematically as element 20 in FIG. 1.

The circuitry of device 10 may also be formed in a regular pattern that makes it amenable to rapid mask programming using special lithographic masks. With one suitable mask-programming arrangement, a customized mask that defines a layer of custom vias is used to program programmable logic device 10. The via hole locations on the mask may be defined using configuration data produced by a programmable logic device design tool.

Regardless of the particular type of programmable element arrangement that is used for device 10, programmable elements are preferably provided with configuration data by a user (e.g., a logic designer). Once provided with configuration data, the programmable elements selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired transmitter and receiver circuitry may be used to assist with high-speed serial communications functions. Hardwired digital signal processing circuitry (e.g., multipliers, adders, etc.) may also be used.

Figure 2:
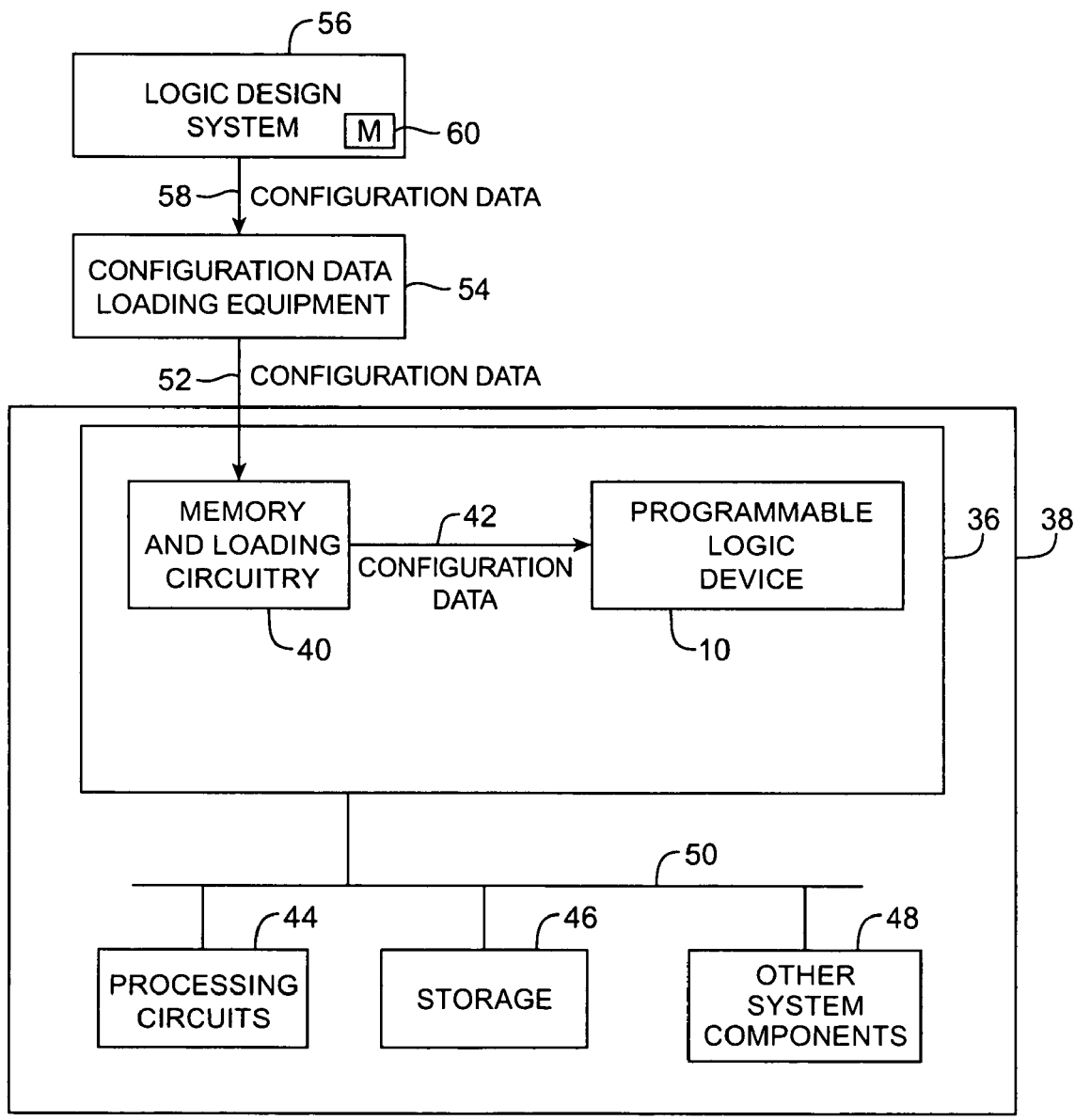
FIG. 2 a diagram of an illustrative system containing a programmable logic device in accordance with the present invention.

An illustrative system environment in which programmable logic device 10 may operate is shown in FIG. 2. Programmable logic device 10 may be mounted on a board 36 in a system 38. In general, programmable logic device 10 may receive programming data from any suitable equipment or device. In the example of FIG. 2, programmable logic device 10 is the type of programmable logic device that receives configuration data from associated memory and loading circuitry 40. With this type of arrangement, a memory chip and separate loading chip or an integrated memory and loading chip may, if desired, be mounted on the same board 36 as programmable logic device 10. The circuitry 40 may, for example, include erasable-programmable read-only memory (EPROM) circuitry for storing configuration data and programmable logic device configuration data loading circuitry for loading the data into device 10. When system 38 boots up (or at another suitable time), the configuration data for configuring the programmable logic device may be supplied to programmable logic device 10 from circuitry 40, as shown schematically by path 42. The configuration data that is supplied to the programmable logic device may be stored in the programmable logic device in configuration data cells (memory).

System 38 may include processing circuits 44, storage 46, and other system components 48. The components of system 38 may be located on one or more boards such as board 36 or other suitable mounting structures or housings and may be interconnected by busses and other electrical paths 50.

Device 40 may be supplied with the configuration data for device 10 over a path such as path 52. Device 40 may, for example, receive the configuration data from configuration data loading equipment 54 or other suitable equipment. Data loading may take place before or after circuitry 40 is installed in system 38.

It can be a significant undertaking to design and implement a desired logic circuit in a programmable logic device. Logic designers therefore generally want to use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device or for producing a custom mask for a mask-programmed chip.

As shown in FIG. 2, the configuration data produced by a logic design system 56 may be provided to equipment 54 over a path such as path 58. The equipment 54 can provide the configuration data to device 40, so that device 40 can later provide this configuration data to the programmable logic device 10 over path 42.

In arrangements of the type shown in FIG. 2, the programmable logic device 10 may have configuration data cells formed from memory cells such as static random-access memory cells. This is merely one illustrative arrangement for programming a programmable logic device 10.

Any suitable arrangement for programming programmable logic device 10 may be used if desired. For example, programmable logic device 10 may be based on non-volatile configuration data cells such as erasable-programmable read-only memory (EPROM) cells. With this type of arrangement, device 10 can be configured by programming the configuration data into the EPROM cells on the device. Programmable logic device 10 may also be based on programmable elements such as fuses and antifuses or programmable elements based on other technologies (e.g., magnetic devices, etc.).

Regardless of the particular approach used for programming programmable logic device 10, programmable logic device 10 can be configured using configuration data produced by a logic design system 56.

Logic design system 56 includes storage 60. Software is used to implement the functions of system 56. The software may be stored on a computer-readable medium (storage) 60. Storage 60 may include computer memory chips, removable and fixed media such as hard disk drives, flash memory, compact discs (CDs), DVDs, and floppy diskettes, tapes, or any other suitable memory or storage device(s). When the software of system 56 is installed, storage 60 has instructions and data that cause the computing equipment in logic design system 56 to execute various methods (processes). When performing these processes, the computing equipment is configured to implement the functions of the logic design system 56.

Figure 3:
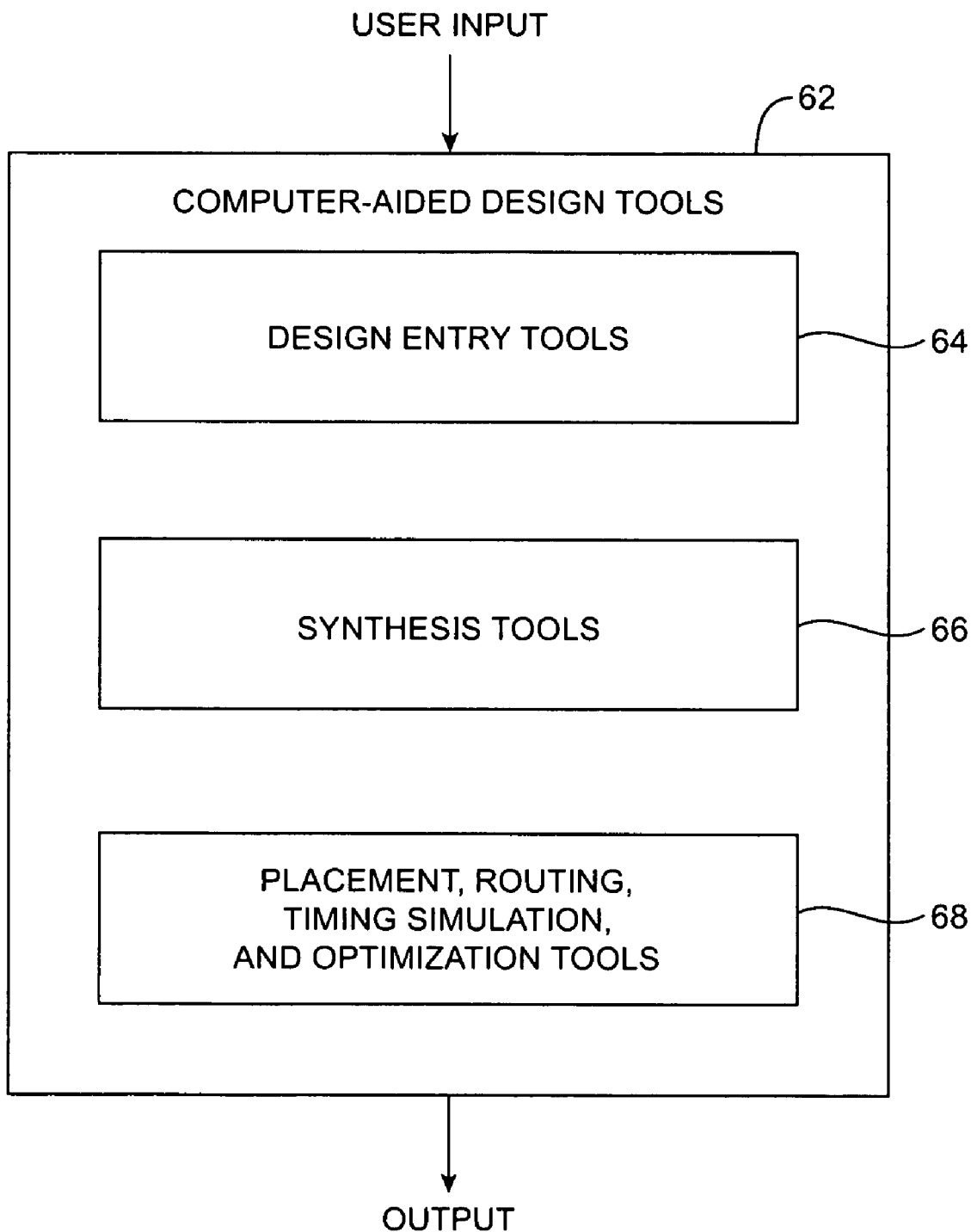
FIG. 3 is a diagram of illustrative computer-aided design tools that may be used to generate configuration data for a programmable logic device integrated circuit in accordance with the present invention.

Logic design system 56 may use computer-aided design tools such as tools 62 of FIG. 3. Tools such as tools 62 may be used to produce the configuration data for electrically programming the programmable logic device 10 from a set of design specifications or other suitable input. Tools such as tools 62 can also be used to generate output in other suitable formats (e.g., as specifications for a via-hole mask for mask-programming the device 10 or lithographic mask sets for semiconductor fabrication of other suitable circuits, etc.).

The design process typically starts with the formulation of logic circuit functional specifications. A logic designer can specify how a desired circuit should function using design entry tools 64. Design entry tools 64 may include design entry aids and design editors. Design entry aids help a logic designer locate a desired design from a library of existing logic designs and may provide computer-aided assistance to the logic designer for entering (specifying) the desired design. A design editor may be used to enter a design (e.g., by entering lines of hardware description language code), may be used to edit a design obtained from a library (e.g., using a design entry aid), or may assist a user in selecting and editing appropriate prepackaged code/designs.

Design entry tools 64 allow a logic designer to provide a desired logic design to logic system 56 using any suitable format. For example, design entry tools 64 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 64 may allow the logic designer to provide a logic design to the logic design system 56 using a hardware description language such as Verilog HDL or VHDL (Very High Speed Integrated Circuit Hardware Description Language). The logic designer can enter the logic design by writing hardware description language code with a design editor. Blocks of code may be imported from libraries if desired.

Using tools 64, a user (e.g., a logic designer or team of logic designers) can provide information on desired constraints for the design. For example, the user can provide information on timing constraints (e.g., maximum or minimum operating frequencies, latencies, etc.). The user can also provide information on what types of optimization the user desires tools 62 to perform (e.g., how the tools 62 should analyze the behavior of the programmable logic device design to estimate and evaluate noise levels, thermal properties, and voltage supply conditions, etc.). User input of this type can also be provided later in the design flow (e.g., when interacting with synthesis tools 66 or tools 68).

After the design has been entered using design entry tools 64, synthesis tools 66 may be used to perform logic synthesis operations on the design. During synthesis, logic circuitry is generated by translating the truth-table, schematic, and/or hardware-description language design specifications into lower-level circuit descriptions. Tools 68 may include functional simulation tools that simulate the functional performance of the design. If the functional performance of the design is incomplete or incorrect, the logic designer can make changes to the design using design entry tools 64. Once the functional operation of the logic design has been determined to be satisfactory, synthesis tool 66 may be used to implement the logic design in a particular programmable logic device and device technology During this process, which is sometimes called "technology mapping", a netlist representation of the logic design is translated into a representation of the design that is specific to the logic and interconnect resources of a particular programmable logic device product or product family. Tools 66 can help ensure proper selection of available hardware to implement different logic functions in the logic design. Often tradeoffs are made because multiple logic functions are competing for limited resources.

After logic synthesis using tools 66, the logic design system may use tools such as placement and routing tools 68 to perform physical design steps (layout synthesis operations). Placement and routing tools 68 are used to determine how to place the circuits for each logic function within the programmable logic device. For example, if two counters interact with each other, the placement and routing tools 68 may locate these counters in adjacent logic regions on the programmable logic device to minimize interconnect delays. The placement and routing tools 68 create orderly and efficient implementations of logic designs for a given programmable logic device.

Tools 68 may analyze the performance of a given design using timing simulation algorithms. A timing simulation may, for example, be used to predict the delay times that are associated with certain signal paths through the device. Timing simulations may be used to verify that the particular implementation of the design that is being tested does not contain signal paths with delays that are outside of the limits imposed during the design phase. For example, the timing simulation algorithm may be used to ensure that the slowest data paths are fast enough that minimum desired clock speed and minimum signal path delay constraints are satisfied. The timing simulation algorithm may also examine the design for potential race conditions or other conditions that affect device performance.

In accordance with the present invention, the tools 68 are able to take into account the effects of congestion. By analyzing local temperature effects, voltage supply effects, and cross-talk effects, tools 68 can mitigate the deleterious effects of congestion and can optimize designs more effectively than with conventional design tools.

After satisfactory optimization using tools 68, the CAD tools 62 can produce electrical configuration data for electrically programming the programmable logic device, can produce configuration data for generating a via mask or other suitable lithographic mask for mask programming the programmable logic device, or can generate other suitable output data. Depending on the type of programmable logic device being used (e.g., a device based on non-volatile memory, a device based on volatile memory, a device based on fuses or antifuses, etc.), configuration data may be programmed into the programmable logic device directly, may be provided to a memory device that later (e.g., upon power-up) loads the configuration data into the programmable logic device to program the device, etc.

During the optimization operations performed by tools 68, the tools 68 can identify areas of a device 10 that are congested and can optimize the design by evaluating design implementations that reduce this congestion. These different potential implementations of the desired logic design in the programmable logic device can be compared against each other and an optimum implementation selected from among the available alternatives. By taking into account the effects of congestion, the logic design tools 64 can be used to produce better design implementations than possible using tools that ignore congestion effects.

Figure 4:
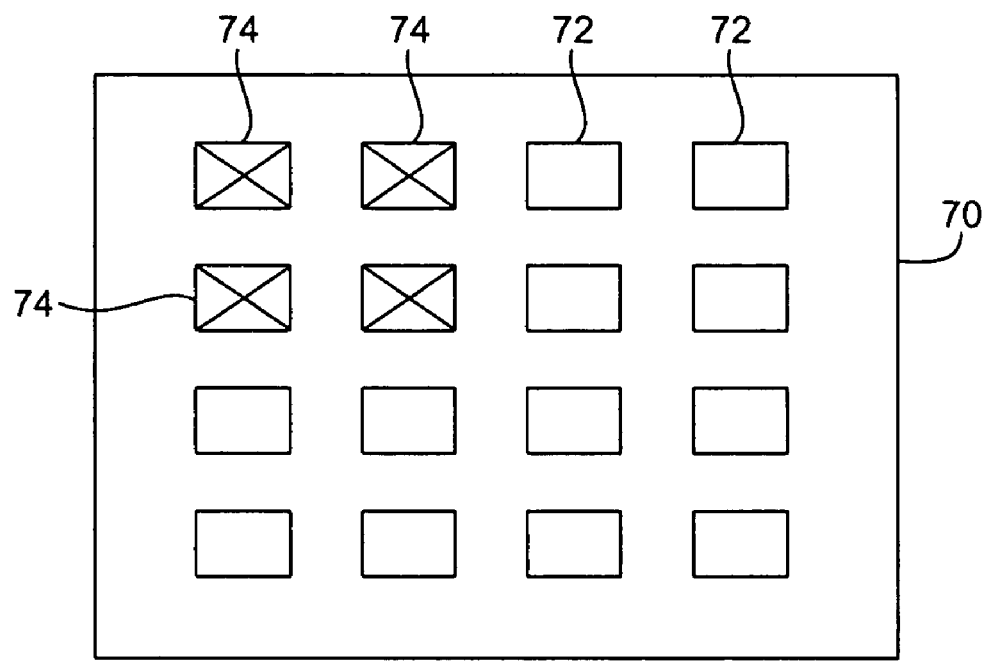
FIG. 4 is a diagram showing how a logic design may be implemented using certain closely-spaced logic regions prior to optimization taking into account the effects of congestion in accordance with the present invention.

An illustrative scenario in which a device design is optimized by reducing congestion is shown in FIG. 4. In the example of FIG. 4, a desired logic design has been implemented in programmable logic device 70. The design uses resources in circuit blocks 74. The circuitry of blocks 72 is left unused (in this illustrative implementation).

There is generally a resistance R and a capacitance C associated with each interconnect. As is well known, the time required to switch a signal from a digital high to a digital low value (or vice versa) is roughly proportional to the product of R and C due to charging effects. If R and C can be reduced without adversely affecting other parameters such as transistor drive currents, signals can propagate more rapidly.

In the illustrative circuit implementation of the logic design that is shown in FIG. 4, the logic design tools 64 have placed the circuitry in a small localized region of the programmable logic device 70. Because the circuit blocks 74 in which the programmable logic resources are being used are close to one another, the lengths of the interconnects used to interconnect the logic of these regions are minimized. This reduces the RC values for these interconnects, which tends to improve the switching times of these interconnects.

However, the optimum performance that is sought by reducing RC delay times with the arrangement of FIG. 4 may not be achieved due to the deleterious effects of congestion. Congestion, which may arise from the overuse of certain circuit resources, can create local "hotspots" of increased temperature. Transistors in hotspots tend to have lower drive currents and exhibit elevated leakage. Congestion may also lead to excessive currents through certain lines such as the power supply lines used to distribute power supply voltages to components on the logic device. These excessive currents can lead to high ohmic losses in the power supply lines, which can reduce power supply voltages to various components of the logic device and cause these components to perform inadequately. Congestion can also lead to increased crosstalk between nearby signal lines. This effect, which can be magnified when adjacent lines are out of phase with respect to each other, may be sufficiently strong to cause the device to exceed noise margin constraints.

Figure 5:
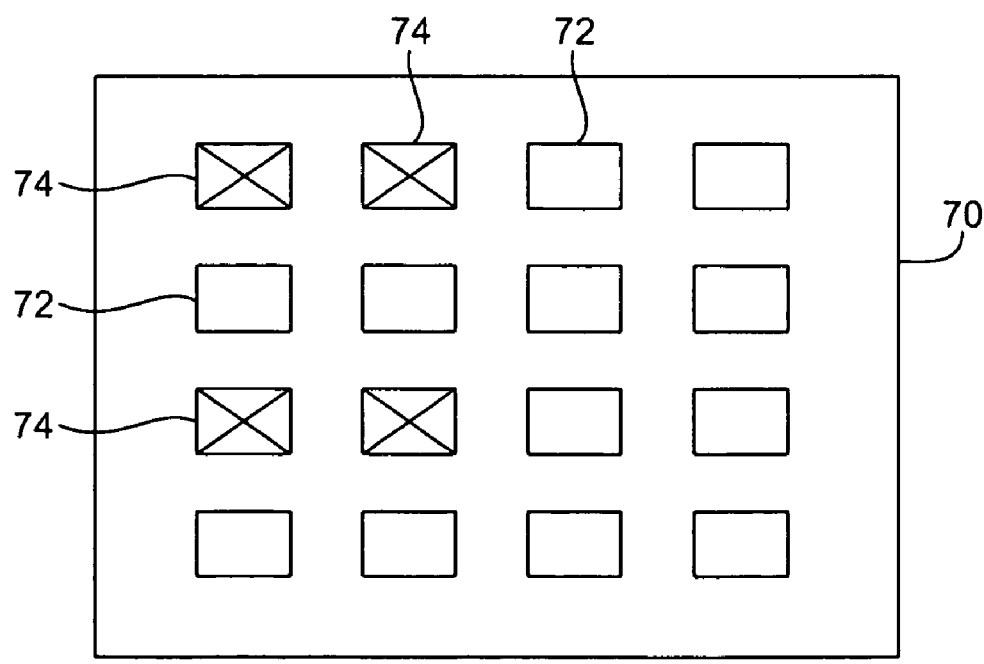
FIG. 5 is a diagram showing how a logic design may be implemented using less closely-spaced logic regions following optimization taking into account the effects of congestion in accordance with the present invention.

The tools 68 therefore preferably take the effects of congestion into account when analyzing the logic design. By using information on congestion that has not previously been available, the tools 68 may determine that a less compact design performs better than a more compact design. For example, the implementation of FIG. 4 may be improved by spreading out the active regions of logic 74, as shown in FIG. 5. Although the arrangement of FIG. 5 is less compact than FIG. 4 and therefore contains longer interconnect pathways, the advantages of reducing temperature, reducing ohmic losses (IR drops) in power lines, and lowering cross talk outweigh the potential advantages of the more compact design. The circuit of FIG. 5 therefore performs better than the circuit of FIG. 4. Using conventional tools, it would not be possible to identify the superiority of the FIG. 5 implementation, because conventional tools are not sensitive to local variations in temperature, power supply voltages, and signal congestion.

The response of various programmable logic device circuit parameters to changes in temperature, power supply voltage, and signal congestion level are shown in FIGS. 6–13.

Figure 6:
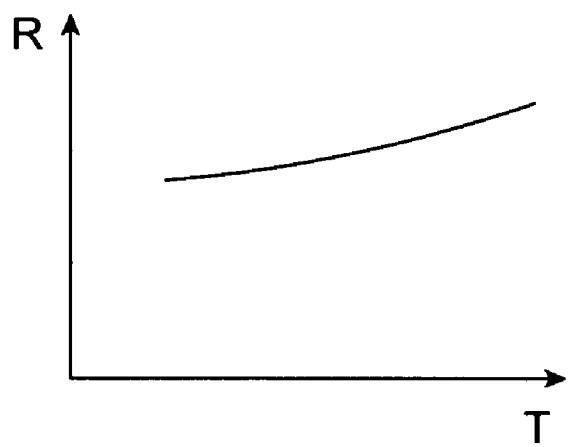
FIG. 6 is a graph showing how increasing temperature on a portion of a programmable logic device tends to increase the resistance of components such as interconnect lines and resistors.

As shown in FIG. 6, the resistance of resistors and circuit components such as interconnect lines tends to increase with increasing temperature T. If the temperature on a particular portion of a device is elevated due to the presence of a hotspot, the interconnects and resistors in that area will also be elevated.

Figure 7:
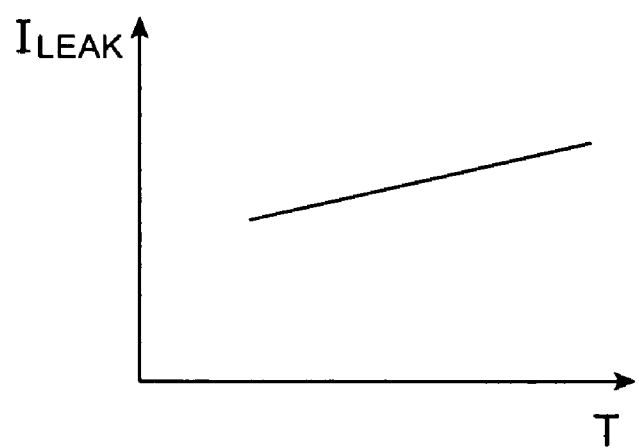
FIG. 7 is a graph showing how increasing temperature on a portion of a programmable logic device tends to increase the leakage current of transistors in that portion of the device.

The graph of FIG. 7 shows how the leakage current of transistors on a programmable logic device tends to increase as temperature increases. Increased leakage current adversely affects circuit performance and should generally be minimized.

Figure 8:
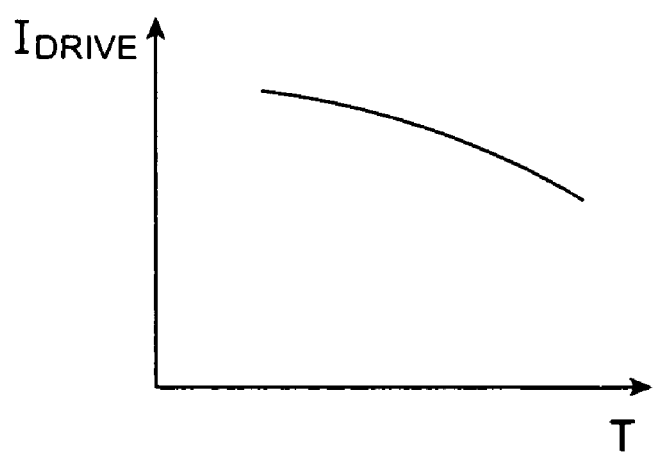
FIG. 8 is a graph showing how the drive current that the transistors on an integrated circuit can produce decreases with increasing temperature.

The drive current of a transistor affects how rapidly that transistor can transmit signals onto an interconnect line. An interconnect line and its associated circuit components have a parasitic capacitance that needs to be charged before the voltage on the line will change states. If the drive current of the output transistor in a driver is low, the driver will not be able to rapidly switch the state of the line connected to that driver. As shown in FIG. 8, drive current tends to decrease with increasing temperature. A circuit may therefore operate more sluggishly in a hotspot than in a cooler region on a chip.

Figure 9:
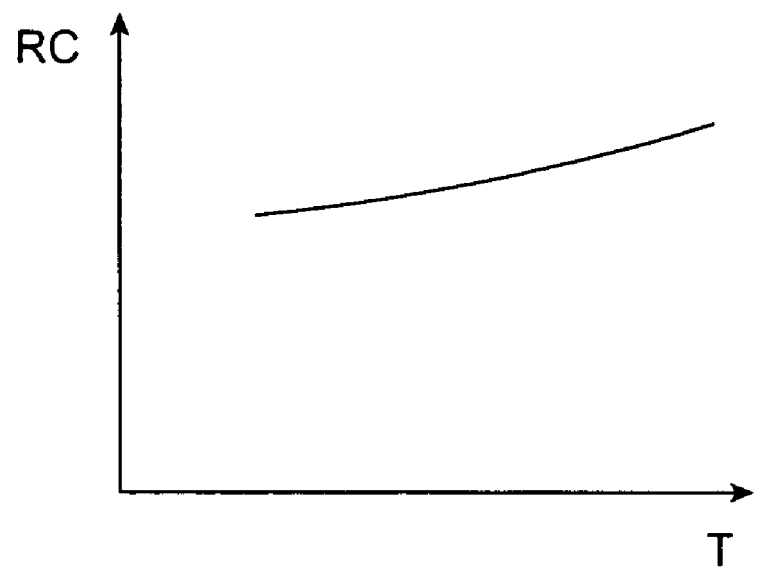
FIG. 9 is a graph showing how the product of the resistance and capacitance of signal lines and other circuit components on a programmable logic device tend to increase with temperature.

The product of the capacitance C of an interconnect line (for example) and its resistance R is given as RC. Large values of RC are associated with large charging times. As shown in FIG. 9, the product of parasitic circuit capacitances C and their resistances R tends to increase with increasing temperature (because the resistance R is increasing as shown in FIG. 6).

Figure 10:
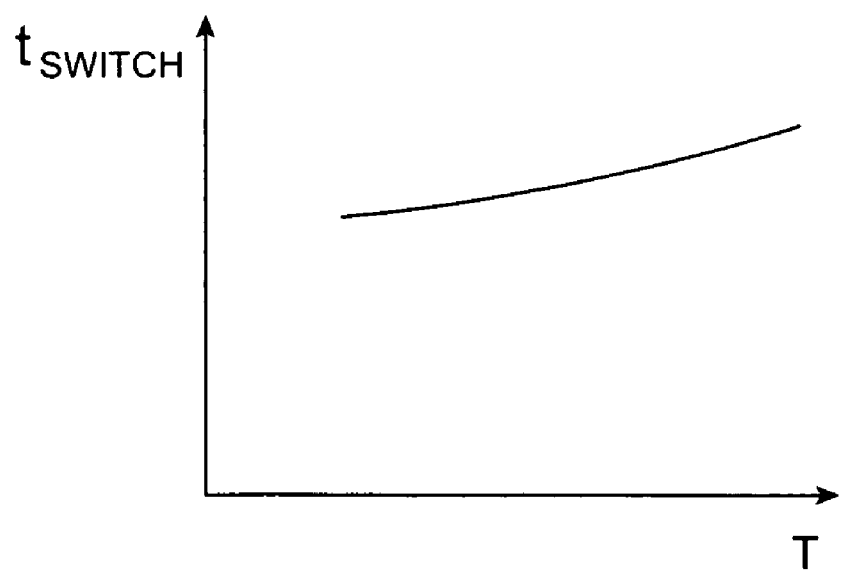
FIG. 10 is a graph showing how programmable logic device component switching times tend to increase with increasing temperature.

Because the RC values associated with interconnect lines and other components on a circuit increase with increasing temperature T (as shown in FIG. 9) and because the drive currents of the transistors that are used to drive signals through these components tends to decrease with increasing temperature (as shown in FIG. 8), the minimum switching time associated with driver circuits ($t_{switch}$) tends to increase with increasing temperature as shown in FIG. 10.

Figure 11:
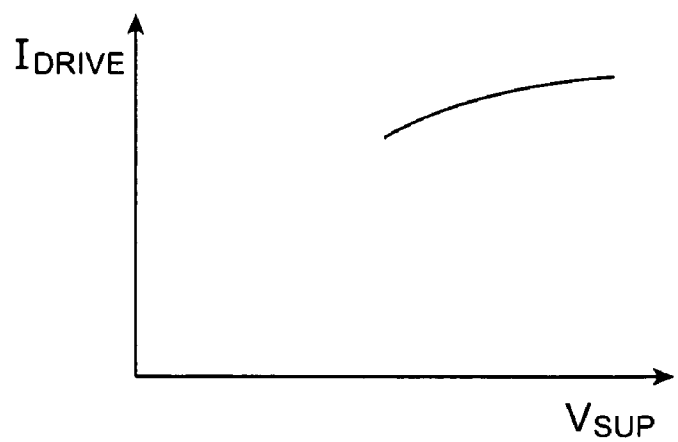
FIG. 11 is a graph showing how transistor drive currents decrease with decreasing voltage supply levels on programmable logic devices.
Figure 12:
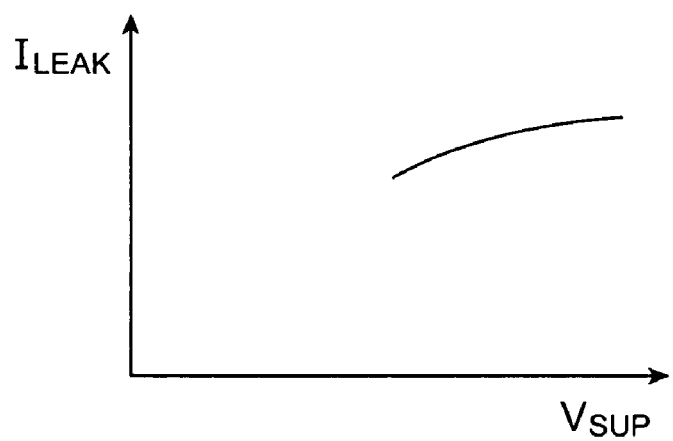
FIG. 12 is a graph showing how transistor leakage currents may decrease with decreasing voltage supply levels on programmable logic devices.

If the power supply voltage Vsup that supplies a given transistor circuit drops due to ohmic losses in power supply distribution lines, the drive current that the circuit can supply also drops as shown in FIG. 11. The leakage current associated with transistors tends to decrease when a power supply line voltage decreases, as shown in FIG. 12. Although reduced leakage current is a beneficial effect, the reduction of drive current that results when the power supply voltage to a particular portion of a circuit is inadequate typically dominates circuit performance.

Figure 13:
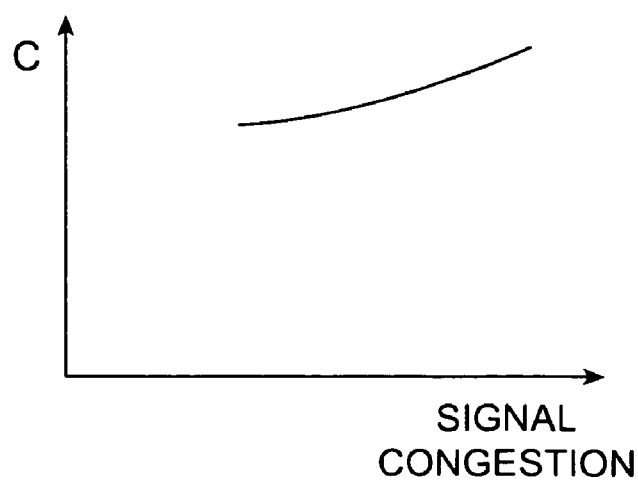
FIG. 13 is a graph showing how the capacitance (coupling) between nodes in a system may increase as signal congestion increases on a programmable logic device.

The effects of signal congestion on capacitance (coupling) between interconnect lines and other circuit components are shown in FIG. 13. As shown in FIG. 13, capacitance between nodes in a device increases with increasing congestion. Both signal proximity and signal type affect signal congestion. If too many signals are crowded into a limited area, there may be unacceptable levels of cross talk. Cross talk levels can also be affected by the type of signals being conveyed through a particular portion of the circuit. For example, out of phase signals on adjacent lines may increase the effective capacitive coupling between those lines when compared to signals with no phase relation to each other.

As shown by FIGS. 6–13, congestion leads to reduced circuit performance, whether due to elevated temperatures, reduced power supply levels, or cross-talk effects. Congestion-related effects such as these affect the performance of a programmable logic device individually and when combined. Tools 68 can consider one of these effects, two of these effects, or all three of these effects, in addition to other parameters that impact circuit performance.

Figure 14:
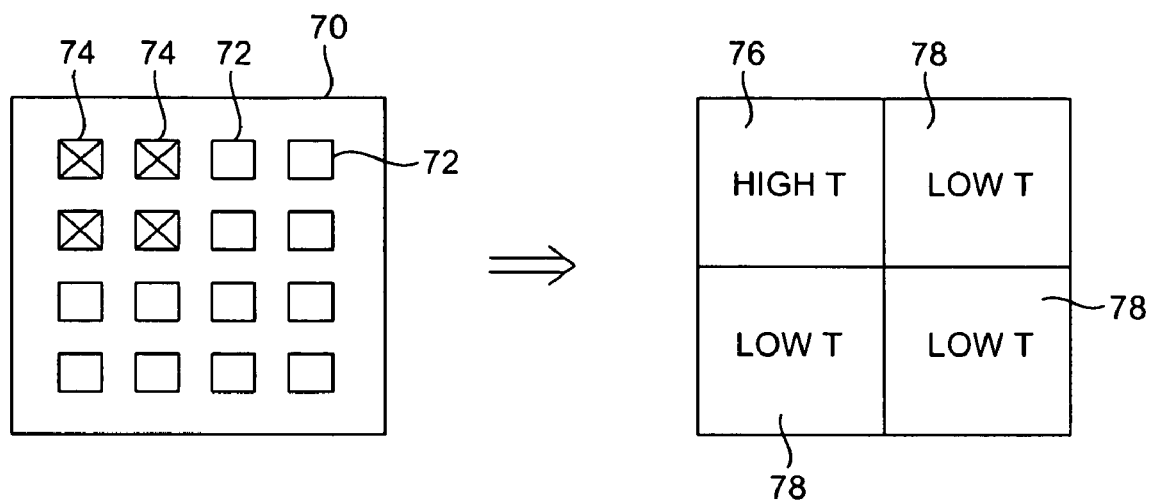
FIG. 14 is a diagram showing the position-dependent thermal profile of an implementation of a logic design on a programmable logic device integrated circuit prior to optimization for thermal effects in accordance with the present invention.

To evaluate the effects of hotspots, tools 68 can calculate the expected temperature for a given design implementation at various locations on the programmable logic device. For example, consider the illustrative circuit arrangement of FIG. 14. In the example of FIG. 14, programmable logic device 70 has active regions 74 and inactive regions 72. The resources of regions 74 are being used to implement a desired logic function for the user. Regions 72 contain unused circuitry. During the placement, routing, and timing simulation, and operations of tools 68, the trial implementation for regions 74 and 72 that is shown in FIG. 14 was produced. The closeness of the active regions 74 is generally preferred, because this reduces RC delays that would otherwise be incurred by long interconnect lines. Accordingly, the tools 68 evaluate this design.

As shown on the right side of FIG. 14, the dense circuit layout of FIG. 14 produces an elevated temperature in the upper left portion 76 of circuit 70 relative to other regions 78. The impact of this elevated temperature is evaluated by tools 68. In particular, tools 68 calculate the position-dependent temperature information shown on the right side of FIG. 14, and use this position-dependent temperature information to calculate temperature-dependent transistor performance figures. Because the transistors in region 76 will switch more slowly than the transistors in regions 78, the tools 68 preferably take into account this reduced switching speed performance when performing timing simulations. This allows tools 68 to determine whether device 70 meets design goals. In some cases, the elevated temperature of region 76 may be acceptable, because the benefits of compactness outweigh the disadvantages of elevated operating temperature. In other cases, however, the presence of the elevated temperature will reduce circuit performance sufficiently that it is better to use a less congested arrangement.

Figure 15:
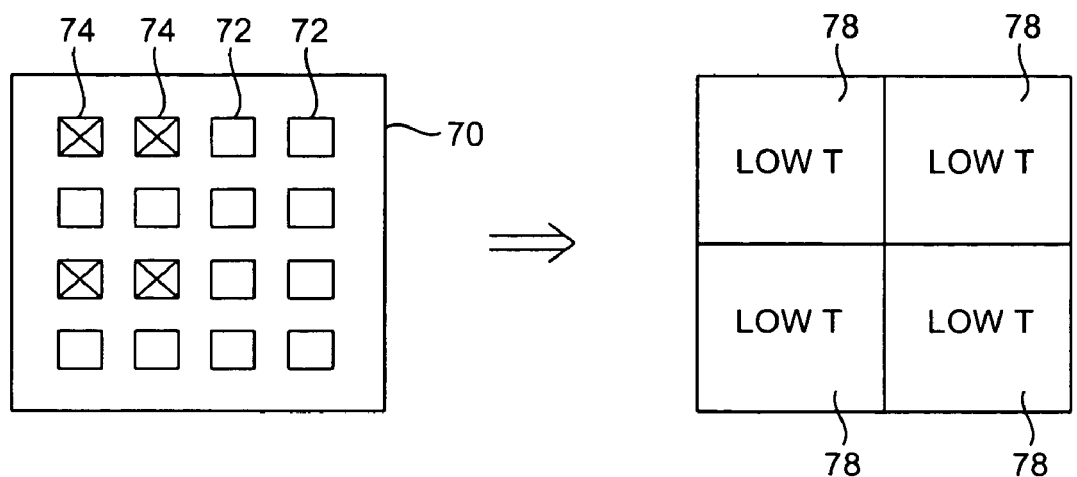
FIG. 15 is a diagram showing the position-dependent thermal profile of an implementation of a logic design on a programmable logic device integrated circuit following optimization for thermal effects in accordance with the present invention.

To evaluate alternatives to the compact arrangement of FIG. 14, the tools 68 preferably generate multiple alternative circuit implementations. An illustrative alternative implementation is shown in FIG. 15. Both variations in placement and variations in routing may be made for each alternative implementation. When evaluating the illustrative design implementation shown on the left of FIG. 15, the tools 68 may calculate the position-dependent temperature information shown on the right side of FIG. 15. In this example, the more spread out circuit implementation of FIG. 15 produces a more even temperature distribution. As shown on the right side of FIG. 15, there are no hotspots on the device, as each region 78 has a relatively low temperature. When the position-dependent temperature information from the right side of FIG. 15 is used in the models of tools 68, it is determined that no transistors are adversely affected by the temperature profile of the device. Thus, even though the arrangement of FIG. 15 is not as compact as FIG. 14, it performs better than the FIG. 14 arrangement because its components are not adversely affected by a hotspot. By performing this type of evaluation for a number of different potential circuit implementations of the user's design, an optimum arrangement may be identified.

Figure 16:
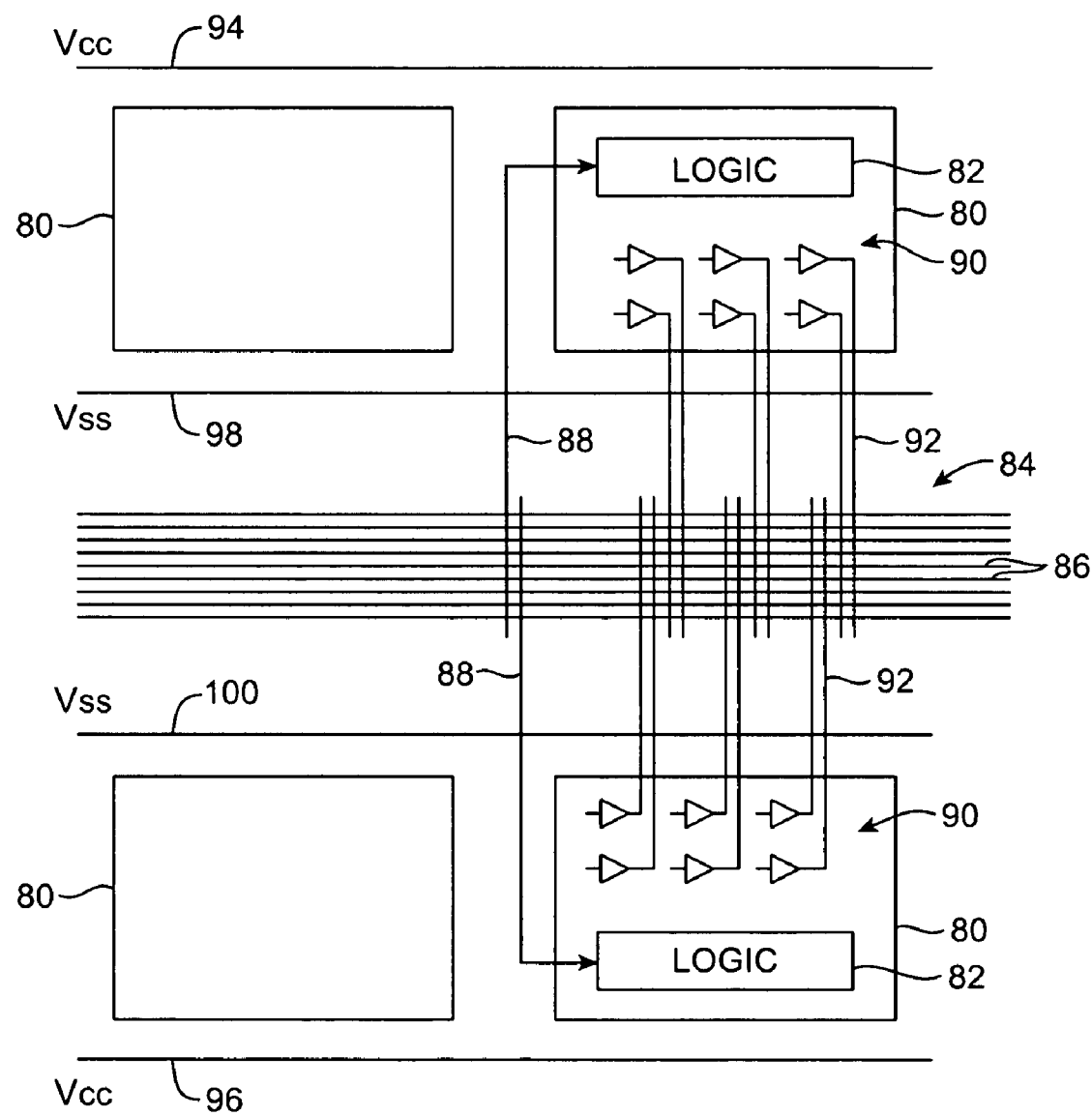
FIG. 16 is a diagram of a portion of an illustrative programmable logic device showing how a logic design implementation can be optimized to reduce the deleterious effects of signal loading on power supply voltage lines in accordance with the present invention.

Tools 68 may also be used to optimize performance by taking into account the effects of congestion on power supply voltages. A portion of an illustrative programmable logic device is shown in FIG. 16. Circuit blocks 80 contain programmable logic such as logic 82. Bus 84 contains multiple interconnect conductors 86. Signals from the interconnect conductors 86 may be routed into blocks 80 using lines such as lines 88. Signals from the logic 82 in each block 80 may be driven back onto available conductors 86 using drivers 90 and lines 92. Programmable and fixed connections may be made between the local routing lines such as lines 88 and 92 and the interconnect conductors 86 using programmable elements (e.g., SRAM-controlled switch elements).

Power is supplied using positive power supply lines 94 and 96 and ground power supply lines 98 and 100. The power supply line arrangement of FIG. 16 is illustrative. Any suitable power distribution arrangement may be used if desired.

The drivers 90 and other circuitry in the upper right block 80 are powered by lines 94 and 98. The drivers 90 and other circuitry in the lower right block 80 are powered by lines 96 and 100. The drivers 90 and other circuits can draw a significant amount of current, which causes ohmic losses (sometimes called "IR" losses) in the power lines and associated drops in the power supply voltages at the supply terminals of the drivers 90 and other circuits. Tools 68 can evaluate whether or not a given design causes such a significant drop in the available power supply voltages for the drivers 90 (and other circuits) that circuit performance is adversely affected. Tools 68 can therefore optimize the design by sacrificing compactness for reduced IR drops in the supply voltages when necessary.

As an example, suppose that a given logic circuit in FIG. 16 requires six active output drivers 90. If these drivers (and the associated logic circuitry that feeds these drivers) are placed in the upper right block 80, all of the current for this circuitry will be drawn through lines 94 and 98. This may cause IR losses in lines 94 and 98 that lead to a significant decrease in the supply voltage across lines 94 and 98. Tools 68 can use this reduced supply voltage (and relationships of the type shown in FIG. 11) to asses the adverse impact of the reduced supply voltage on the performance of the device.

Tools 68 can also evaluate an alternative implementation for the given logic circuit in which the six active drivers are divided equally between the upper and lower blocks 80.

With this type of alternative arrangement, the IR drop on lines 94 and 98 is reduced by approximately half, because lines 96 and 100 are used to power the drivers in the lower block. This improves the performance of the drivers 90 that are supplied by lines 94 and 98. Although spreading the drivers 90 (and associated circuits) across two blocks 80 instead of one results in a less compact circuit, the improvement in the performance of the drivers 90 relative to the situation in which all of the drivers draw current through a single pair of lines improves overall performance (in this example). Taking into account IR drops in power supply lines when optimizing the logic design can therefore lead to identification of a more optimal implementation of a user's desired logic design in the programmable logic device.

Tools 68 can take signal congestion effects into consideration in evaluating potential design implementations for device 10. Signal congestion arises when signal lines are in close proximity to one another. Excessive crowding of signals can lead to elevated levels of cross talk. The deleterious effects of congestion can be exacerbated when certain signals interact poorly. For example, the capacitance between two lines can be effectively doubled when the signals on these lines are out of phase. This can be understood with reference to FIGS. 17–19.

Figure 17:
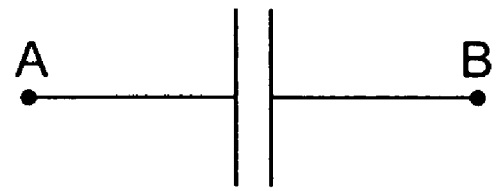
FIG. 17 is a diagram of a capacitor showing the capacitance between nodes A and B.

As shown in FIG. 17, two nodes A and B, which may represent two parallel interconnect conductors, have an associated capacitance C. There is a relationship between the charge Q that is stored on this capacitance C and the associated voltage change ΔV across this capacitance, as shown by the equation of FIG. 17.

Figure 18:
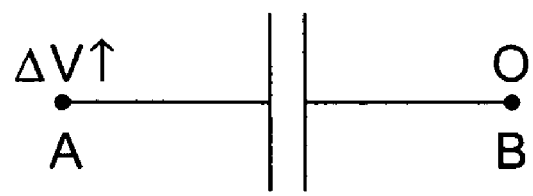
FIGS. 18 and 19 are diagrams showing how the effective capacitance of the capacitor of FIG. 17 is dependent on the signals on nodes A and B.
Figure 19:
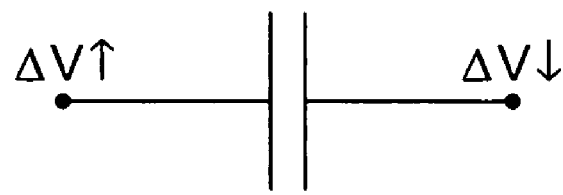

As shown in FIG. 18, when node A experiences signal changes of magnitude ΔV while node B is grounded, the voltage change between nodes A and B and the equation of FIG. 17 holds. In this situation, the effective capacitance between nodes A and B is C. If, however, the signals on nodes A and B are out of phase, the voltage on node B may drop by ΔV while the voltage on node A is rising by ΔV, as shown in FIG. 19. This makes the right side of the equation in FIG. 17 appear as though the capacitance C has doubled. Because the effective capacitance between nodes A and B doubles when the signals on A and B are out-of-phase, the cross-talk between nodes A and B is exacerbated. Tools 68 therefore preferably take into account signal congestion due both to signal proximity and signal type (e.g., relative phase).

Figure 20:
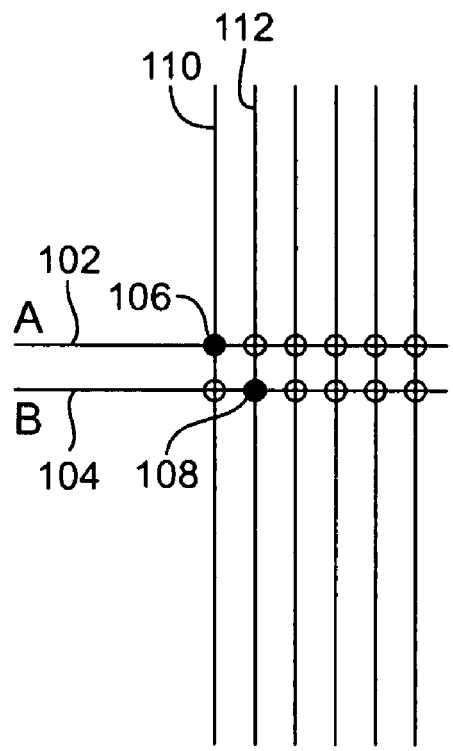
FIG. 20 is a diagram showing a portion of an illustrative programmable logic device integrated circuit prior to optimization to reduce cross-talk due to capacitive effects in accordance with the present invention.

An illustrative circuit implementation of a design that can be improved by considering the effects of signal congestion is shown in FIG. 20. In the arrangement of FIG. 20, branch conductors 102 and 104 are connected to interconnect lines 110 and 112 through programmable connections 106 and 108. The other programmable connections associated with lines 102 and 104 are not programmed (i.e., they remain open circuits), as indicated by the open circles in FIG. 20. Connections 106 and 108 are programmed, however, so that conductive pathways are formed between lines 102 and 110 and between line 104 and 112, as indicated by the solid dots in FIG. 20. With this arrangement, lines 110 and 112 (and their associated branch conductors) act as the nodes A and B in the discussion of FIGS. 17–19. As described in connection with FIGS. 17–19, there is an undesirable electrical coupling between lines 110 and 112 that is exacerbated when the signals on lines 110 and 112 are out of phase.

Figure 21:
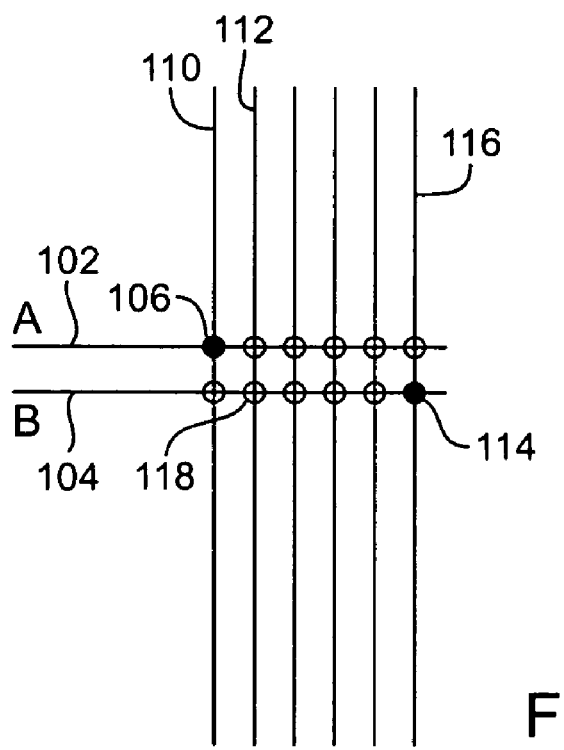
FIG. 21 is a diagram of the portion of the illustrative programmable logic device integrated circuit of FIG. 20 following optimization to reduce cross-talk due to capacitive effects in accordance with the present invention.

When tools 68 detect the arrangement of FIG. 20 in a proposed circuit design and particularly when the tools 68 identify out-of-phase relationships between certain signal pairs, the tools 68 can evaluate potential circuit implementations of the type shown in FIG. 21. In the arrangement of FIG. 21, a programmable connection between line 104 and line 116 is made using programmable connector 114, while programmable conductor 118 remains unprogrammed. This set of connections routes signals to line 116 that would otherwise be routed to line 112. Particularly in situations in which the signals on node B are out of phase with the signals on node A, the greater distance between lines 110 and 116 relative to the distance between lines 112 and 110 helps to reduce cross talk and improve device performance.

Figure 22:
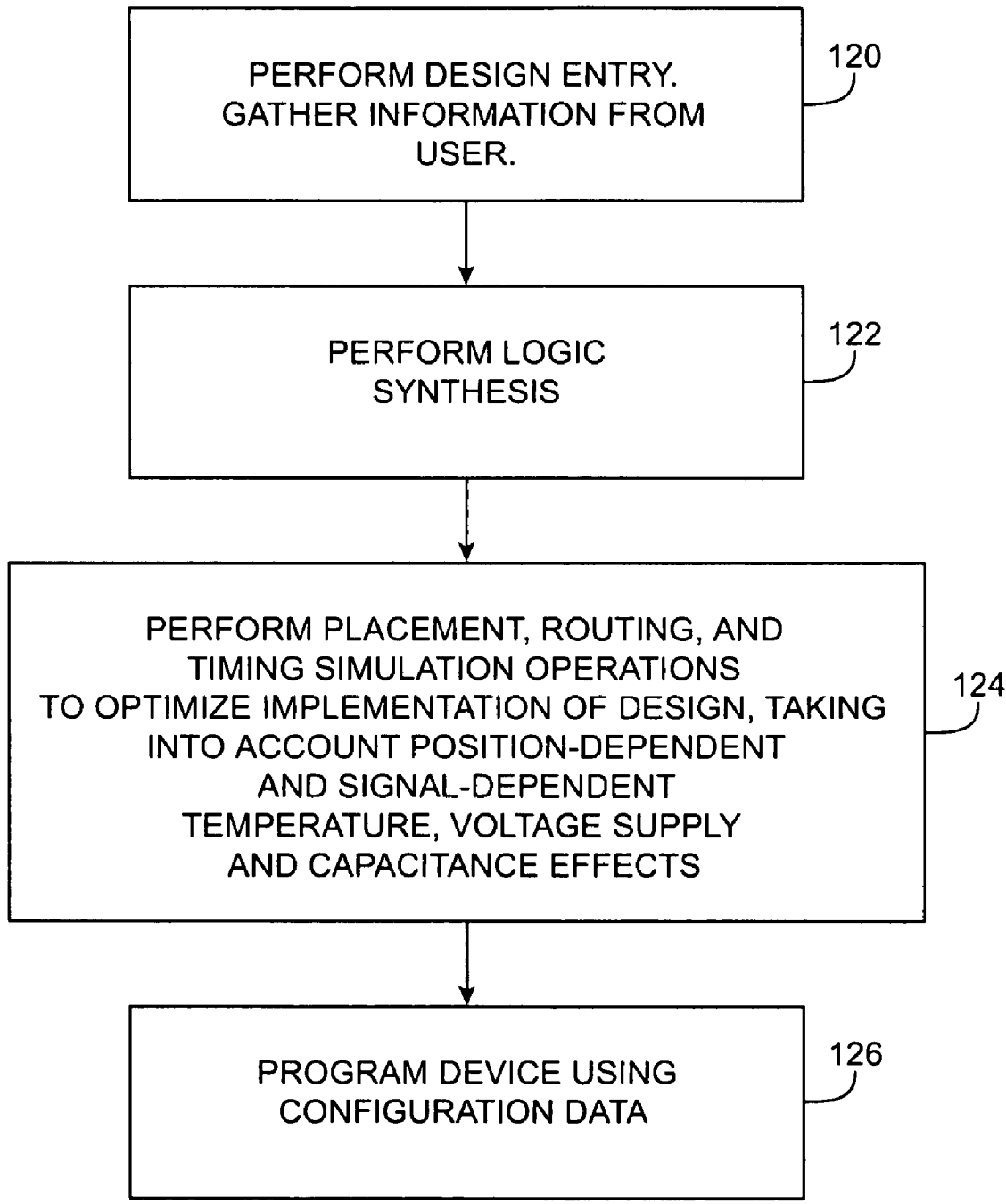
FIG. 22 is a flow chart of illustrative steps involved in identifying and using optimized programmable logic device implementations of desired custom logic functions in accordance with the present invention.

Illustrative steps involved in designing and programming an optimized programmable logic device are shown in FIG. 22. At step 120, a user can use design entry tools 64 (FIG. 3) to provided provide CAD tools 62 (FIG. 3) with design specifications. For example, the user can provide tools 62 with information on a desired logic circuit for a programmable logic device using hardware description language. The user can also provide tools 62 with information on design constraints (e.g., information on the minimum and maximum desired speed for the device or other suitable timing constraints, information on desired power consumption and noise levels, information on criteria for identifying hotspots, IR loading effects, and signal congestion effects, or any other suitable inputs or parameters. The user inputs may, if desired, be provided using a screen of clickable options, fillable boxes, and drop-down menus. Inputs may be provided at any suitable time during the operation of tools 62. Tools 62 may also use information from logic design libraries, technology mapping databases (e.g., databases of information on various programmable logic device components), and other suitable databases.

At step 122, synthesis tools 66 (FIG. 3) may be used to perform logic synthesis operations on the user's desired design. Step 122 may involve testing a synthesized design for functional compliance with design specifications.

Following successful synthesis operations at step 122, at step 124 tools 68 (FIG. 3) may be used to perform operations related to placement (implementing circuits at appropriate locations within the device), routing (using appropriate interconnects in the device), and timing simulation (to verify that timing constraints are satisfied). During step 124, the tools 68 preferably analyze multiple possible implementations of the user's desired logic design in the programmable logic device while taking into account one or more position-dependent and signal-dependent effects. Tools 68 may use position-dependent information on temperature and power supply voltages and signal-dependent and proximity (position) dependent capacitance information to analyze effects such as position-dependent temperature effects, position-dependent voltage supply effects (IR drops), and congestion-dependent cross-talk effects. During step 124, transistor performance (e.g., transistor drive current, leakage current, etc.), component resistances (e.g., line resistances, resistor resistances, etc.), and capacitance (e.g., as shown in FIG. 13) are simulated based on calculated values of position-dependent temperature (e.g., different temperatures on the programmable logic device at different locations), position-dependent voltage supply level (e.g., different voltage supply levels on various voltage supply lines as influenced by the current drawn by drivers and other components on the device), and capacitance (e.g., capacitive effects that are influenced by congestion effects).

The analysis of the various implementations that is performed at step 124 allows the tools 62 to be used to select an optimum implementation of the user's design in a given programmable logic device (family of programmable logic devices). Because this optimization takes into account position-dependent and signal-dependent information on temperature, supply voltage and cross talk, the optimization can be accurate, even when these congestion effects are significant contributors to device performance. The tools 62 can produce a suitable output for the design during step 124 (e.g., by producing a configuration data file for electrical loading into a device 10 or for use in mask programming a device 10).

Once a satisfactory design has been obtained at step 124 and the configuration data has been generated, an arrangement of the type described in connection with FIG. 2 may be used to program the programmable logic device (step 126).

The process of producing an optimized design at step 124 may involve multiple design iterations. A flow chart of an illustrative iterative arrangement for producing an optimized implementation of the user's design in a programmable logic device during step 124 is shown in FIG. 23.

Figure 23:
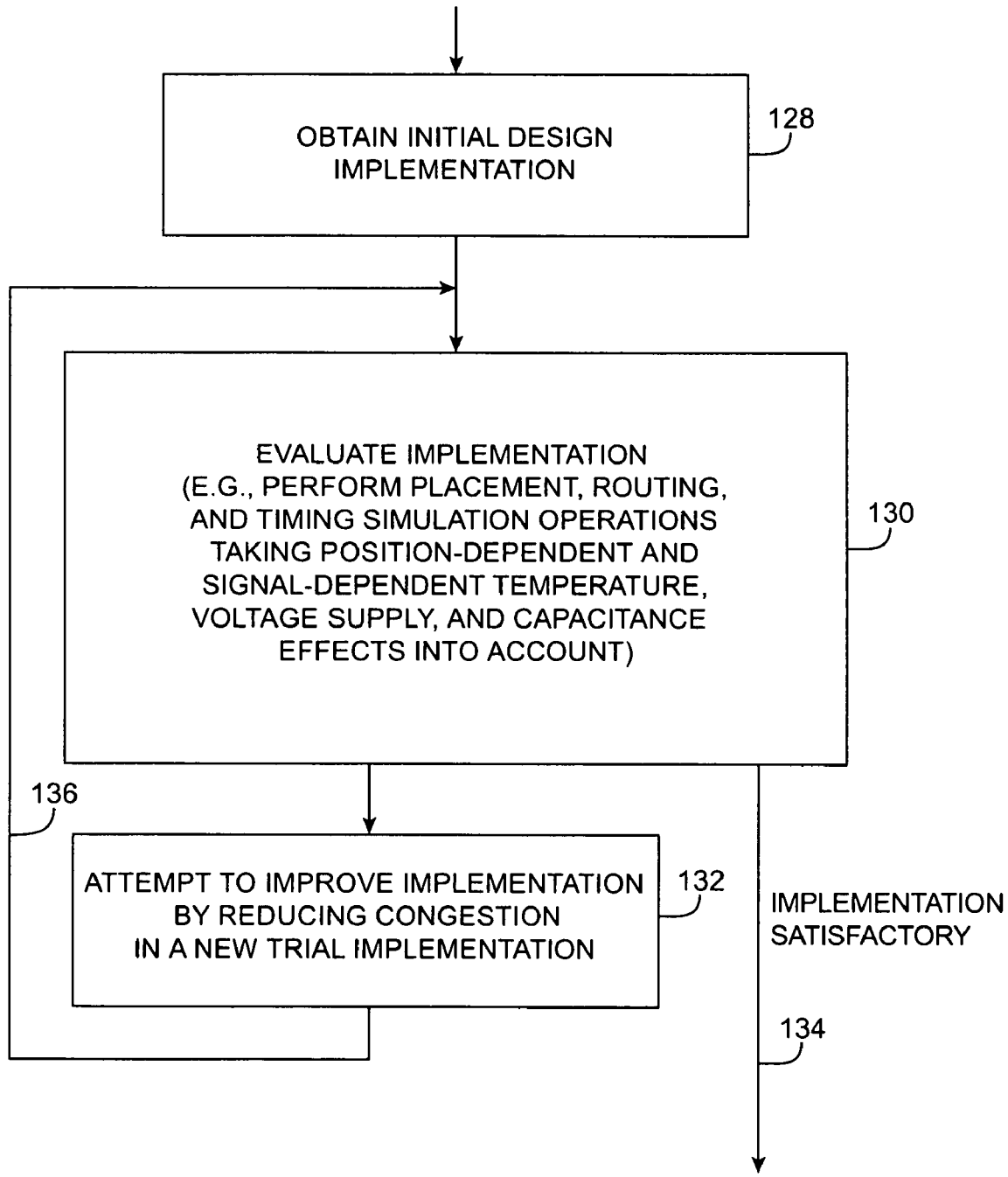
FIG. 23 is a flow chart of illustrative steps involved in optimizing a programmable logic device design by taking into account the effects of congestion in accordance with the present invention.

In the process of FIG. 23, the operations of step 124 may be repeated for various trial implementations until a satisfactory or optimal implementation has been identified. At step 128, tools 68 may obtain an initial design implementation (e.g., an implementation of the user's design in the programmable logic device that has been generated based on assumed default values of temperature, power supply voltage, and capacitance between lines). The default values may be nominal values or may be estimated based on known circuit parameters. For example, an initial temperature value may be estimated by assuming that temperature does not vary with position, but that temperature is dependent on the quantity of circuitry being used.

At step 130, the implementation is analyzed by performing placement, routing, and timing simulation operations. During step 130, tools 68 generate position-dependent temperature information and use this information to model how transistors and other circuit elements in the design implementation are expected to behave at various locations on the circuit. Tools 68 also take into account ohmic losses in power supply lines due to various amounts of circuit loading. In portions of the circuit where there are large currents in the power supply lines, ohmic losses in the power supply lines will cause the power supply voltage to drop below their nominal values. Tools 68 use information on power supply voltage drops due to ohmic losses to model how transistors and other devices are expected to behave at different locations on the circuit. Signal congestion (capacitance) effects due to signal proximity and signal type (out of phase relationships, etc.) may also be taken into account during step 130.

If the design implementation is determined to be satisfactory (or if the process times out by satisfying other criteria), the tools may proceed to step 126 of FIG. 22, as indicated schematically by line 134.

If more analysis is to be performed, the tools 68 can attempt to identify a better implementation of the design by creating a new trial implementation at step 132. The trial implementation may, for example, involve modifications of the type discussed in connection with FIGS. 15–21. If a hotspot is identified, the circuitry in the vicinity of the hotspot can be moved to reduce congestion. This reduces the temperature produced by the circuitry in the vicinity of the hotspot and may eliminate the hotspot. If significant voltage drops are identified on certain power supply distribution lines, circuitry can be moved so that less current is drawn through the lines. If signal congestion is leading to coupling effects between various lines, the routing of the signals through the lines can be adjusted to move signals (and particularly out-of-phase signals or other signals that interact poorly with each other) so that they are farther apart. These actions may be taken together or individually.

After a new proposed implementation of the design has been generated at step 132, the process can loop back to step 130 for evaluation of the implementation as shown by line 136.

Figure 24:
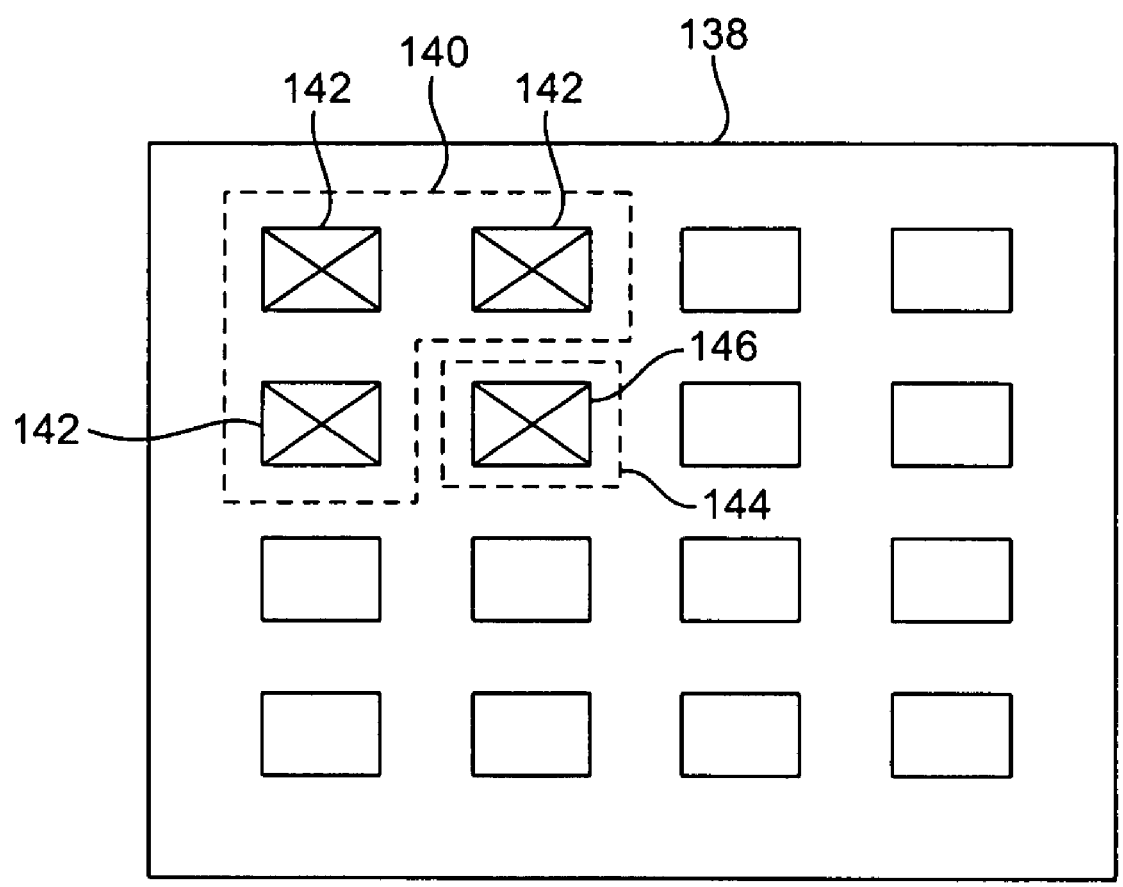
FIG. 24 is a diagram of an illustrative programmable logic device showing how circuit regions with congestion can be analyzed using different types of models than those used to analyze uncongested regions in accordance with the present invention.

To avoid over-taxing the tools 68 during the evaluation process, it may be desirable to model congested areas with a more accurate model (e.g., the well-known SPICE model) than is used in those areas that are less congested. As shown in FIG. 24, a programmable logic device 138 may have four active circuits 142 and 146. During step 130 (FIG. 22), it may be determined that the circuits within boundary 140 (i.e., circuits 142) are relatively uncongested. For example, these circuits may not be expected to exhibit hotspots, significant IR drops in their power supplies, or signal congestion effects. Accordingly, these areas can be modeled using placement, routing, and timing simulation algorithms that are position and signal invariant. It may also be determined during step 130 (FIG. 22) that the circuitry of area 144 (i.e., circuit 146) is congested (or potentially congested). Because it is expected that the circuitry of area 144 may be congested, a different type of model (e.g., the SPICE program) may be used to evaluate the performance of the circuitry in region 144. This model may take into account position-dependent and signal-dependent values for temperature, power supply voltage, and capacitance (cross-talk).

Figure 25:
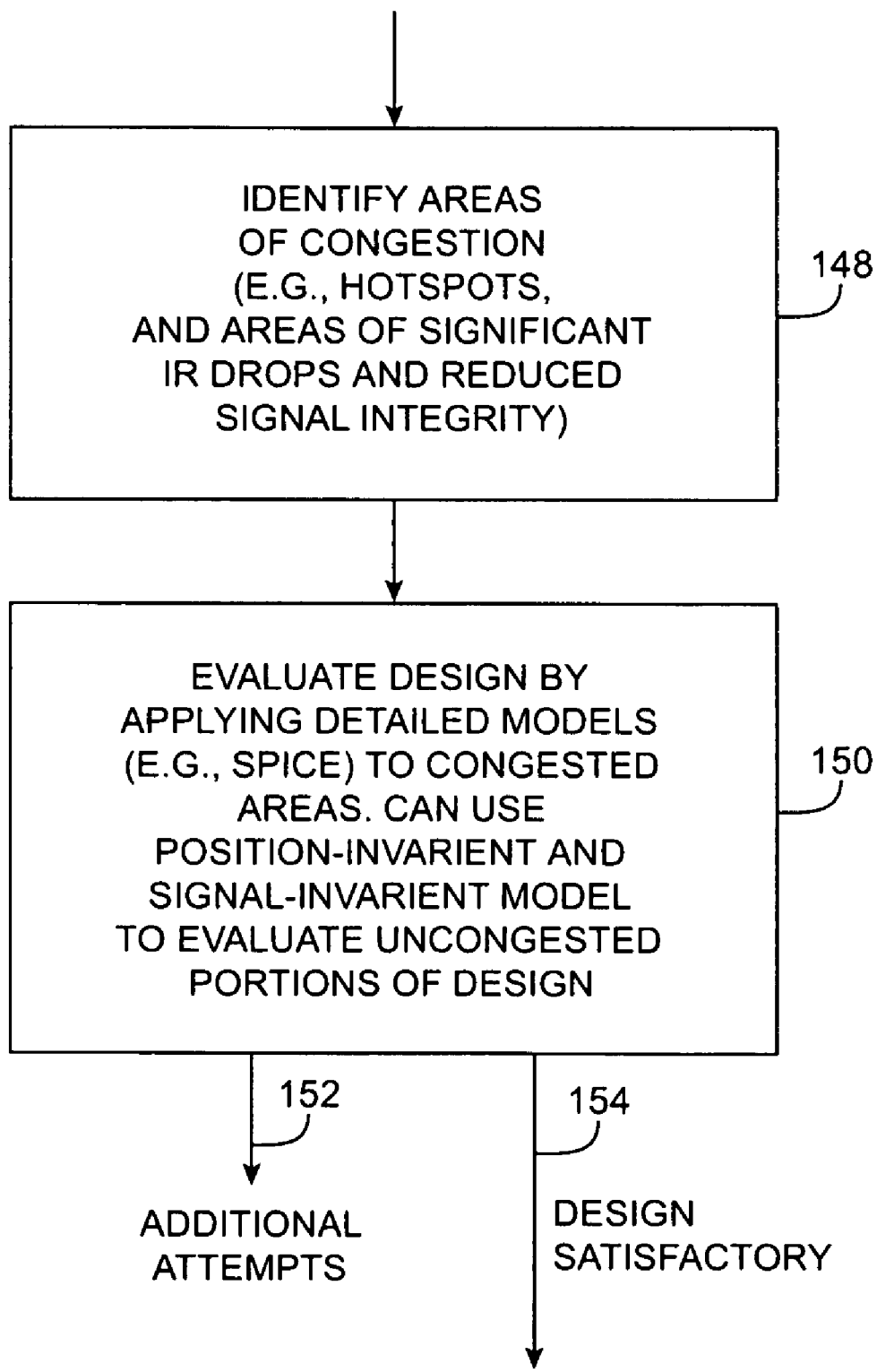
FIG. 25 is a flow chart of illustrative steps involved in analyzing a programmable logic device design using different types of tools for different areas in accordance with the present invention.

Illustrative steps involved in performing step 130 of FIG. 23 using the approach of FIG. 24 are shown in FIG. 25. At step 148, the tools 68 may identify areas of congestion in a given implementation of the user's design. For example, a thermal model may be used to generate an estimation of the position-dependent temperature of the device. All circuitry whose temperature is estimated to exceed a predetermined or user-selected threshold value (e.g., 125° C.) may be labeled as a hotspot. As another example, whenever the current drawn through a particular voltage supply line causes a voltage drop that exceeds a particular predetermined or user-defined threshold value, that voltage line may be labeled as experiencing excessive IR drops due to congestion. Cross talk effects can be identified by examining the expected response of the circuit to default or user-supplied test vectors. This signal information can be used to evaluate the interactions between signals on the device to identify signal-based congestion. Signal congestion may also be identified by counting the number or density of active signal lines per unit area or by using other density-based approaches.

After identifying the locations of congestion at step 148, tools 68 may be used to evaluate the given implementation of the design at step 150. Portions of the implementation without congestion may be evaluated using models that do not take position-dependent and signal-dependent temperature, power supply and capacitive effects into consideration. Locations in the implementation of the user's design where congestion is present may be modeled using models that are capable of evaluating the effects of congestion. An example of one suitable model that can evaluate these effects is the well known SPICE model. If desired, SPICE functionality can be incorporated into tools 68 for performing step 150.

The results from the less-detailed model and the more-detailed model may be automatically integrated to produce an overall evaluation of the implementation. If the implementation of the user's design that has been evaluated is satisfactory, the optimization process is complete, and the user may proceed to program the device at step 126 of FIG. 22 to implement the user's design in the programmable logic device, as shown by line 154. If more evaluation is to be preformed, the process continues at step 132 of FIG. 23, as shown by line 152.

The foregoing is merely illustrative of the principles of this invention and various modifications can be made by those skilled in the art without departing from the scope and spirit of the invention.

What is claimed is:

1. A method for using computer-aided design tools to create programmable logic devices, comprising:
   with the computer-aided design tools, receiving design specifications from a user for a desired logic design for a programmable logic device integrated circuit; and
   with the computer-aided design tools, automatically analyzing each of a plurality of different possible implementations of the desired logic design in the programmable logic device integrated circuit to identify an optimum implementation of the desired logic design, wherein automatically analyzing each of the plurality of different possible implementations of the desired logic design in the programmable logic device integrated circuit comprises modeling how circuit elements in each possible implementation are expected to behave as a function of position-dependent temperatures.

2. The method defined in claim 1 further comprising:
   using position-dependent information on power supply voltages when analyzing the plurality of different possible implementations of the desired logic design in the programmable logic device integrated circuit.

3. The method defined in claim 1 further comprising:
   using signal-dependent capacitance information when analyzing the plurality of different possible implementations of the desired logic design in the programmable logic device integrated circuit.

4. The method defined in claim 1 further comprising:
   using position-dependent information on power supply voltages when analyzing the plurality of different possible implementations of the desired logic design in the programmable logic device integrated circuit; and
   analyzing the effects of signal congestion on crosstalk noise when analyzing the plurality of different possible implementations of the desired logic design in the programmable logic device integrated circuit.

5. The method defined in claim 1 wherein analyzing each of the plurality of different possible implementations comprises:
   simulating transistor performance using position-dependent temperatures.

6. The method defined in claim 1 wherein analyzing each of the plurality of different possible implementations comprises:
   calculating which temperatures are expected at different portions of the programmable logic device integrated circuit for each implementation of the desired logic circuit; and
   using the calculated temperatures to determine how temperature-dependent transistor drive currents are affected at each of the different portions for each implementation.

7. The method defined in claim 1 wherein analyzing each of the plurality of different possible implementations comprises:
   using position-dependent power supply voltage information to model transistor performance.

8. The method defined in claim 1 wherein analyzing each of the plurality of different possible implementations comprises:
   calculating power supply line voltages at various positions on the programmable logic device integrated circuit for each implementation of the desired logic design; and
   using the calculated power supply line voltages to calculate transistor drive currents for each implementation.

9. The method defined in claim 1 wherein analyzing each of the plurality of different possible implementations comprises:
   evaluating cross-talk effects using information on signal proximities and signal types.

10. The method defined in claim 1 further comprising:
    generating programmable logic device configuration data for the optimum implementation.

11. A method for using computer-aided design tools to create programmable logic devices, comprising:
    with the computer-aided design tools, receiving design specifications from a user for a desired logic design; and
    identifying an optimum implementation of the desired logic design in a programmable logic device integrated circuit by automatically analyzing each of a plurality of different possible implementations of the desired logic design in the programmable logic device integrated circuit, wherein automatically analyzing each of the plurality of different possible implementations of the desired logic design in the programmable logic device integrated circuit comprises modeling how power supply voltages on the programmable logic device integrated circuit are expected to be affected by ohmic losses in each different possible implementation.

12. The method defined in claim 11 further comprising:
    using local temperature information to analyze the plurality of different possible implementations of the desired logic design in the programmable logic device integrated circuit.

13. The method defined in claim 11 further comprising:
    using the computer-aided design tools to analyze signal congestion effects when analyzing the plurality of different possible implementations of the desired logic design to identify the optimum implementation.

14. The method defined in claim 11 wherein the programmable logic device integrated circuit has power supply lines and wherein identifying the optimum implementation comprises:
    calculating voltage drops along the power supply lines due to currents drawn by circuit components in each of the different possible implementations of the desired logic design in the programmable logic device integrated circuit; and
    analyzing how the calculated voltage drops affect transistor performance in each of the different possible implementations of the desired logic design in the programmable logic device integrated circuit.

15. The method defined in claim 11 wherein each different possible implementation of the desired logic design in the programmable logic device integrated circuit has a different configuration of signal lines, the method further comprising:
    calculating cross-talk levels for at least some of the different configurations of signal lines; and
    using the calculated cross-talk levels to help identify the optimum implementation of the desired logic design in the programmable logic device integrated circuit.

16. The method defined in claim 11 wherein each different possible implementation of the desired logic design in the programmable logic device integrated circuit has a different configuration of signal lines, the method further comprising:

calculating cross-talk levels for at least some of the different configurations of signal lines;

locating hotspots in at least some of the implementations; and using the calculated cross-talk levels to help identify the optimum implementation of the desired logic design in the programmable logic device integrated circuit.

17. A method for generating configuration data for a programmable logic device integrated circuit, the method comprising:

receiving a logic design from a logic designer with a logic design system;

with the logic design system, automatically analyzing each of a plurality of different possible implementations of the logic design in the programmable logic device integrated circuit, wherein automatically analyzing each of the plurality of different possible implementations of the desired logic design in the programmable logic device integrated circuit comprises modeling component temperatures that are expected to be produced as a function of position in each different possible implementation to identify hotspots; and using information on the identified hotspots in producing the configuration data with the logic design system to implement the logic design in the programmable logic device integrated circuit.

18. The method defined in claim 17 further comprising using a more-detailed model to analyze the identified hotspots and using a less detailed model to analyze regions in the logic design other than the identified hotspots.

19. The method defined in claim 17 wherein the programmable logic device integrated circuit includes power supply lines, the method further comprising:

analyzing the logic design to determine how much voltage drop is experienced on at least some of the power supply lines; and using information on how much voltage drop is experienced on the power supply lines in producing the configuration data.

20. The method defined in claim 17 wherein the programmable logic device integrated circuit includes power supply lines, the method further comprising:

analyzing the logic design to determine how much current is drawn through at least some of the power supply lines;

using information on how much current is drawn through the power supply lines and temperature information for the identified hotspots in modeling transistor performance on the programmable logic device; and using the modeled transistor performance in producing the configuration data for the programmable logic device integrated circuit.

* * * * *